United States Patent
Zhang

(10) Patent No.: US 9,634,235 B2
(45) Date of Patent: Apr. 25, 2017

(54) METHOD FOR MANUFACTURING LIQUID EJECTING HEAD

(71) Applicant: Seiko Epson Corporation, Tokyo (JP)

(72) Inventor: Junhua Zhang, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 64 days.

(21) Appl. No.: 14/222,002

(22) Filed: Mar. 21, 2014

(65) Prior Publication Data

US 2014/0290828 A1  Oct. 2, 2014

(30) Foreign Application Priority Data

Mar. 26, 2013 (JP) ................................ 2013-065263

(51) Int. Cl.
*C03B 29/00* (2006.01)
*B29C 65/00* (2006.01)
(Continued)

(52) U.S. Cl.
CPC .......... *H01L 41/29* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1632* (2013.01); *B41J 2/1637* (2013.01); *H01L 41/083* (2013.01); *H01L 41/27* (2013.01); *H01L 41/273* (2013.01); *H01L 41/277* (2013.01); *H01L 41/335* (2013.01); *B41J 2002/14419* (2013.01); *B41J 2002/14491* (2013.01); *C04B 37/003* (2013.01); *C04B 2237/56* (2013.01); *C04B 2237/62* (2013.01)

(58) Field of Classification Search
CPC ....... H01L 41/083; H01L 41/22; H01L 41/27; H01L 41/273; H01L 41/29; H01L 41/31; H01L 41/312; H01L 41/335; H01L 41/277; B41J 2/14233; B41J 2002/14241; B41J 2002/14266; B41J 2/14274; B41J 2/161; B41J 2/1612; B41J 2/1626; B41J 2/1628; B41J 2/1629; B41J 2/1632; B41J 2/1634; C04B 37/00; C04B 37/003; C04B 2237/56; C04B 2237/62
See application file for complete search history.

(56) References Cited

U.S. PATENT DOCUMENTS 5,512,793 A * 4/1996 Takeuchi ............. B41J 2/14233
                                                                310/328
5,856,837 A * 1/1999 Kitahara ............. B41J 2/14233
                                                                310/365
(Continued)

FOREIGN PATENT DOCUMENTS

JP  2006-159418 A  6/2006

*Primary Examiner* — Alex Efta
(74) *Attorney, Agent, or Firm* — Kilpatrick Townsend & Stockton LLP

(57) ABSTRACT

A method for manufacturing a liquid ejecting head including a laminate formed of a flow path substrate having a flow path communicating with nozzle openings that eject a liquid, a first electrode, a piezoelectric layer, and a second electrode, the method including stacking the first electrode, the piezoelectric material, the second electrode, and a reinforcing member on top of one another to form a laminate; heating the laminate to form a piezoelectric layer made of the piezoelectric material; bonding the laminate to the flow path substrate on a first electrode side; and removing the reinforcing member.

7 Claims, 4 Drawing Sheets

(51) Int. Cl.
*H01L 41/29* (2013.01)
*H01L 41/335* (2013.01)
*H01L 41/277* (2013.01)
*H01L 41/273* (2013.01)
*H01L 41/27* (2013.01)
*H01L 41/083* (2006.01)
*B41J 2/16* (2006.01)
*B41J 2/14* (2006.01)
*C04B 37/00* (2006.01)

(56) References Cited

U.S. PATENT DOCUMENTS

| | | | | |
|---|---|---|---|---|
| 5,860,202 A * | 1/1999 | Okawa | ................... | B41J 2/1612 |
| | | | | 29/25.35 |
| 5,962,955 A * | 10/1999 | Tsukada et al. | ............... | 310/366 |
| 6,431,691 B1 * | 8/2002 | Tanikawa | ............. | B41J 2/14209 |
| | | | | 347/68 |
| 2004/0256953 A1 * | 12/2004 | Kitagawa | ............. | B41J 2/14233 |
| | | | | 310/324 |
| 2007/0214621 A1 * | 9/2007 | Furuya | ........................ | 29/25.35 |

* cited by examiner

METHOD FOR MANUFACTURING LIQUID EJECTING HEAD

This application claims priority to Japanese Patent Application No. 2013-065263, filed Mar. 26, 2013, the entirety of which is incorporated by reference herein.

BACKGROUND

1. Technical Field

The present invention relates to a method for manufacturing a liquid ejecting head having nozzle openings that eject a liquid, and particularly a method for manufacturing an ink jet recording head that discharges an ink as the liquid.

2. Related Art

An exemplary ink jet recording head as one example of a liquid ejecting head includes a flow path forming substrate having a pressure generating chamber communicating with nozzle openings, and a piezoelectric actuator that is fixed to one surface of the flow path forming substrate and that changes the pressure in the pressure generating chamber (see JP-A-2006-159418, for example).

The piezoelectric actuator includes a first electrode, a piezoelectric layer made of a piezoelectric material, and a second electrode. The first electrode, the piezoelectric layer, and the second electrode are formed into a laminate. The laminate is heated in order to fire the piezoelectric layer, and is bonded to a flow path forming substrate to produce the piezoelectric actuator.

Unfortunately, as the piezoelectric layer becomes thinner, the piezoelectric layer is more liable to crack or chip during handling, which results in a reduced yield.

Such a problem remains unsolved not only in the method for manufacturing an ink jet recording head but also in a method for manufacturing a liquid ejecting head that ejects a liquid other than an ink.

SUMMARY

An advantage of some aspects of the invention is that it provides a method for manufacturing a liquid ejecting head that attains improved handling properties of the liquid ejecting head by suppressing the probability of breakage of the piezoelectric layer.

In order to solve the problem, an aspect of the invention is a method for manufacturing a liquid ejecting head including a laminate formed of a flow path substrate having a flow path communicating with nozzle openings that eject a liquid, a first electrode, a piezoelectric layer, and a second electrode. The method includes stacking the first electrode, the piezoelectric material, the second electrode, and a reinforcing member on top of one another to form a laminate; heating the laminate to form a piezoelectric layer made of the piezoelectric material; bonding the laminate to the flow path substrate on a first electrode side; and removing the reinforcing member.

According to such an aspect, the rigidity of the laminate can be improved by forming the laminate with the reinforcing member. The enhanced rigidity can suppress cracking or chipping of the laminate during handling of the laminate, and a thinner piezoelectric layer can be obtained.

It is preferable that, in the removing of the reinforcing member, the reinforcing member in a predetermined region excluding a connection region be partially removed to leave the reinforcing member having a predetermined thickness. Preferably, at least part of the reinforcing member and at least part of the second electrode in the connection region be removed to form a through hole, and an electrically conductive material be disposed in the through hole to form an electric conductor. According to this aspect, the electric conductor allows electrical connection between the second electrode and an external wiring or others.

It is also preferable that the connection region be a region in which the first electrode is not disposed. According to this aspect, a distance between the first electrode and the electric conductor can be increased thereby reducing the probability of breakage of the piezoelectric layer due to electric field concentration.

It is also preferable that in the bonding of the laminate, the flow path substrate be bonded to the laminate with a vibration plate being interposed between the flow path substrate and the laminate. According to this aspect, a piezoelectric actuator including the vibration plate can be formed.

It is also preferable that the reinforcing member be formed of the same material as that used for the second electrode. According to this aspect, even if the reinforcing member remains, the second electrode can be electrically connected to external wiring or the like with the reinforcing member.

It is also preferable that the reinforcing member be formed of the same material as that used for the piezoelectric material. According to this aspect, since the reinforcing member can have a coefficient of linear expansion the same as that of the piezoelectric material, the probability of warpage, which is caused by thermal contraction and expansion may be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the aspect of the invention will be described in detail based on an embodiment.

First Embodiment

Figure 1:
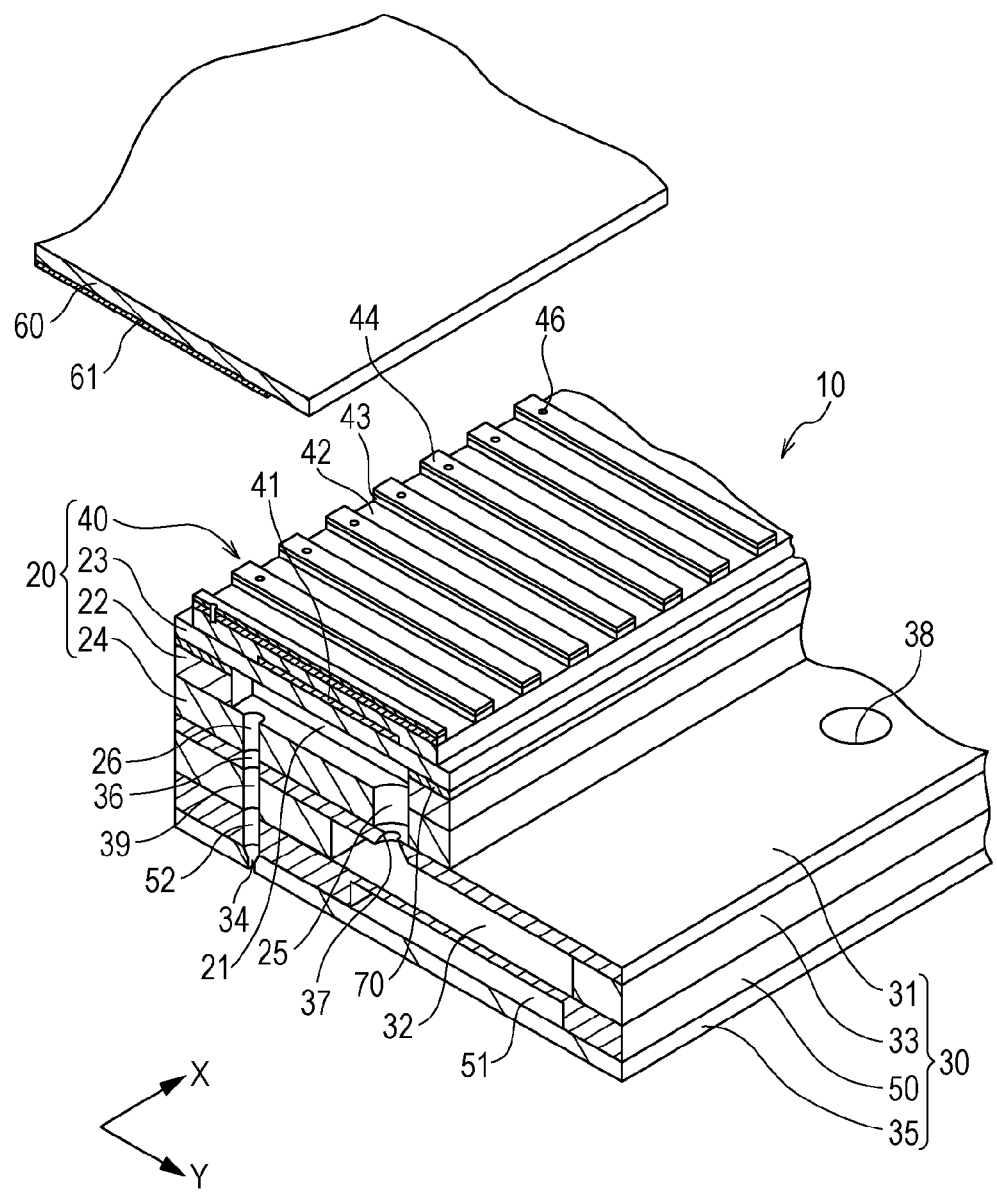
FIG. 1 is a perspective view showing a recording head according to First Embodiment of the invention.
Figure 2A:
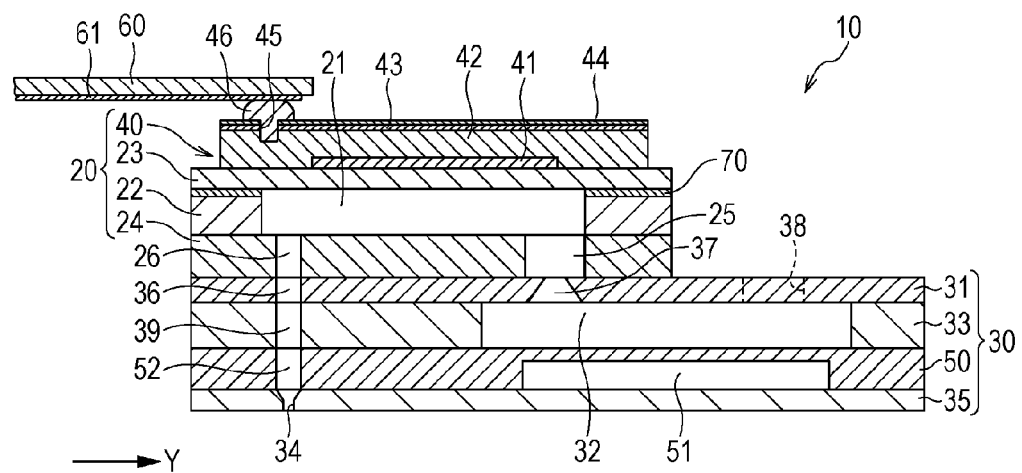
FIG. 2A is a sectional view of the recording head according to First Embodiment of the invention and FIG. 2B is an enlarged sectional view of the recording head.
Figure 2B:
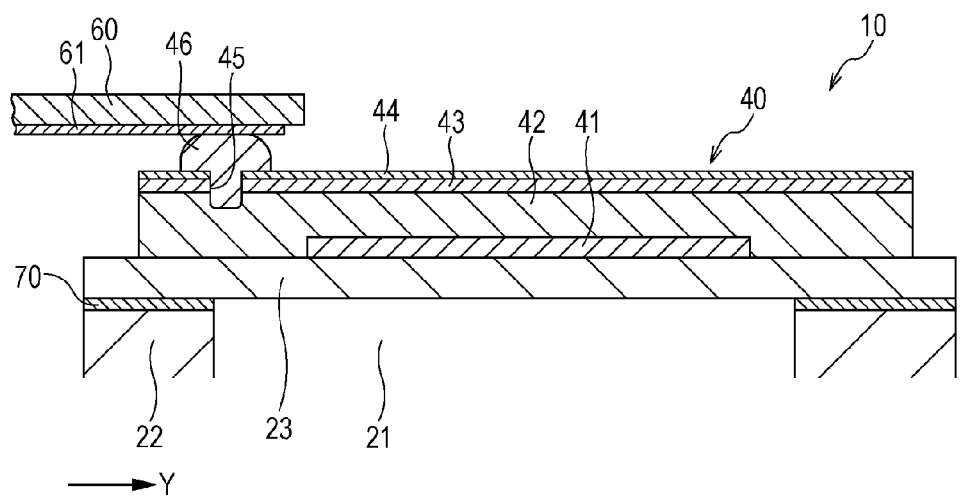

FIG. 1 is a perspective view of an exemplary ink jet recording head as one example of a liquid ejecting head of First Embodiment of the invention. FIG. 2A is a sectional view of the ink jet recording head, and FIG. 2B is an enlarged sectional view showing main components of the ink jet recording head.

As shown, an ink jet recording head 10 of the present embodiment includes an actuator unit 20 and a flow path unit 30 to which the actuator unit 20 is fixed.

The actuator unit 20 is an actuator device including a plurality of piezoelectric actuators 40 which serve as pressure generating units. The actuator unit 20 also includes a flow path forming substrate 22 that is a flow path substrate having a pressure generating chamber 21, a vibration plate 23 disposed on one surface of the flow path forming substrate 22, and a pressure generating chamber bottom plate 24 disposed on the other surface of the flow path forming substrate 22.

The flow path forming substrate 22 is made of a ceramic material such as alumina ($Al_2O_3$) and zirconia ($ZrO_2$), an inorganic film made of silicon oxide or the like, or a metal material such as stainless steel (SUS). In the present embodiment, a plurality of pressure generating chambers 21 are aligned in the direction of alignment of a plurality of nozzle openings that discharge an ink of the same color. Hereinafter, the direction is referred to as a first direction X of the pressure generating chamber 21. The direction intersecting perpendicular to the first direction X in a plane where the vibration plate 23 is disposed on the flow path forming substrate 22 is referred to as a second direction Y.

The vibration plate 23 is fixed to the one surface of the flow path forming substrate 22 in such a manner as to seal the pressure generating chambers 21. The vibration plate 23 is formed of a thin plate made of alumina ($Al_2O_3$), zirconia ($ZrO_2$), a piezoelectric material used for a piezoelectric layer 42 specifically described later, a silicon single-crystal material, a metal material such as stainless steel (SUS), or an organic material such as a polyimide resin. In particular, by using the same piezoelectric material for the vibration plate 23 and the piezoelectric layer 42, the vibration plate 23 and the piezoelectric layer 42 can be formed at the same time by firing the piezoelectric material, and the vibration plate 23 can be bonded to the piezoelectric actuator 40 without an adhesive, details of which will be described later. In the present embodiment, the vibration plate 23 is made of the same piezoelectric material as that used for the piezoelectric layer 42 specifically described later, and is bonded to the one surface of the flow path forming substrate 22 with an adhesive 70.

The pressure generating chamber bottom plate 24 is fixed to the other surface of the flow path forming substrate 22 so as to seal the pressure generating chambers 21 on the other side of the flow path forming substrate 22. The pressure generating chamber bottom plate 24 includes a feed communicating hole 25 disposed in the vicinity of one end of the pressure generating chamber 21 in the second direction Y to communicate between the pressure generating chamber 21 and a manifold 32 described later, and a nozzle communicating hole 26 disposed in the vicinity of the other end of the pressure generating chamber 21 in the second direction Y to communicate with a nozzle opening 34 described later.

The piezoelectric actuators 40 are disposed on a region of the vibration plate 23, facing the respective pressure generating chambers 21.

In the present embodiment, each of the piezoelectric actuators 40 includes a first electrode 41 disposed on the vibration plate 23, a piezoelectric layer 42 continuously disposed over the pressure generating chambers 21, a second electrode 43 independently disposed on the piezoelectric layer 42 for each pressure generating chamber 21, and a reinforcing member 44 disposed on the second electrode 43.

In the present embodiment, the first electrode 41 is disposed continuously over the pressure generating chambers 21 aligned in the first direction X and functions as a common electrode for the piezoelectric actuators 40. The first electrode 41 also functions as part of the vibration plate. Alternatively, a first electrode 41 may be provided for each of the piezoelectric actuators 40.

The piezoelectric layer 42 is also disposed continuously over the pressure generating chambers 21 in the same manner as the first electrode 41. An exemplary piezoelectric material used for such a piezoelectric layer 42 is a high dielectric ceramic material exhibiting an electrical-mechanical conversion effect. The material used for the piezoelectric layer 42 can be a material containing lead (Pb), titanium (Ti), and zirconium (Zr), for example, a high dielectric piezoelectric material such as lead zirconate titanate (PZT), or a high dielectric piezoelectric material containing a metal oxide such as niobium oxide, nickel oxide, or magnesium oxide. Alternatively, the piezoelectric layer 42 may be a composite oxide including a lead-free piezoelectric material containing no lead such as bismuth ferrate or bismuth ferrate manganate and barium titanate or bismuth potassium titanate.

The second electrode 43 is an individual electrode disposed for each piezoelectric actuator 40 disposed in a corresponding pressure generating chamber 21. In the present embodiment, the first electrode 41 is used as the common electrode for the piezoelectric actuators 40 while the second electrodes 43 are used as individual electrodes disposed for the respective piezoelectric actuators 40. These first and second electrodes can be used the other way around to fit in with the arrangement of the driving circuit or wiring.

Although specifically described later, the materials for the first electrode 41 and the second electrode 43 need to have thermal resistance against the temperatures used during the formation of the piezoelectric layer 42 because the first electrode 41 and the second electrode 43 are simultaneously heated when the piezoelectric layer 42 is formed by heating the material. Examples of such materials include metal materials such as gold (Au), silver (Ag), platinum (Pt), iridium (Ir), and copper (Cu) and composite materials thereof.

The second electrode 43 includes the piezoelectric layer 42 on one side of the second electrode 43 and the reinforcing member 44 on the other side thereof. Although specifically described later, such a reinforcing member 44 is used in the manufacturing of the ink jet recording head, and part of the reinforcing member remains after the production. Although specifically described later, the material used for the reinforcing member 44 needs to have thermal resistance against the temperatures used when heating the piezoelectric material in order to form the piezoelectric layer. The material used for the reinforcing member 44 can be any of metal materials and ceramic materials such as alumina ($Al_2O_3$), zirconia ($ZrO_2$), piezoelectric materials used for the piezoelectric layer 42, and silicon single-crystal substrates.

The reinforcing member 44 has a through hole 45 vertically penetrating through the reinforcing member 44. The through hole 45 is disposed in a region of the reinforcing member 44 outside of the region of the reinforcing member facing the first electrode 41. Namely, the through hole 45 is disposed in a region of the reinforcing member 44 not facing the first electrode 41.

The through hole 45 vertically penetrates through the reinforcing member 44 and the second electrode 43. In other words, the through hole 45 is formed by vertically removing part of the piezoelectric layer 42 on the side of the second electrode 43. The through hole 45 may vertically penetrate through the reinforcing member 44 to expose the second electrode 43. Considering variations that occur when forming the through hole 45, however, it is desirable that the through hole 45 be made to penetrate through the thin second electrode 43 by removing a vertical part of the piezoelectric layer 42 on the side of the second electrode 43 so as to expose the inner side surfaces of the second electrode 43 to the through hole 45.

The through hole 45 has an electric conductor 46 having conductivity therein to electrically connect the second electrode 43 via the electric conductor 46 to a wiring layer 61 disposed on an external wiring, that is, a wiring substrate 60. Namely, in the present embodiment, the region including the through hole 45 functions as a connection region. Although not shown, both ends of the first electrode 41 in the first direction X of piezoelectric actuator 40 are electrically connected to both ends of the wiring layer 61 in the first direction X disposed on the wiring substrate 60, respectively.

In the present embodiment, the electric conductor 46 electrically connecting the wiring layer 61 to the second electrode 43 is formed by filling the through hole 45 with the same material as that used for the second electrode 43. Any material having high conductivity may be used as the material used for the electric conductor 46 without limitation. For example, any of metal materials such as gold (Au), silver (Ag), platinum (Pt), and solder can be used.

The through hole 45 including the electric conductor 46 is disposed in a region not facing the first electrode 41, that is, in a position not overlapping the first electrode 41 when seen in planar view from the second electrode 43 side. If the through hole 45 is disposed in a position facing the first electrode 41, the distance between the electric conductor 46 and the first electrode 41 is undesirably shorter than the distance between the second electrode 43 and the first electrode 41 which causes electric fields to be concentrated in a region between the electric conductor 46 and the first electrode 41 which, in turn, leads to breakage of the piezoelectric layer 42. In other words, the through hole 45 can be disposed in a region not facing the first electrode 41 so as to avoid there being a short distance between the first electrode 41 and the electric conductor 46, thereby reducing the likelihood of breakage of the piezoelectric layer 42. Alternatively, the through hole 45 may be disposed in a position facing the pressure generating chamber 21 or a position not facing the pressure generating chamber 21. Desirably, the through hole 45 is located in a position not facing the pressure generating chamber 21 because the electric conductor 46 inhibits deformation of the piezoelectric actuator 40.

The piezoelectric actuator 40 receives a driving signal fed from a driving circuit not shown via the wiring substrate 60. The driving circuit, although not shown, may be implemented on the wiring substrate 60, or may be implemented in a component other than the wiring substrate 60.

When a ceramic material is used to form the flow path forming substrate 22 and the pressure generating chamber bottom plate 24 in the actuator unit 20, for example, a clay-like ceramic material or the so-called green sheet is molded so as to have a predetermined thickness, and is drilled in order to form the pressure generating chamber 21. The flow path forming substrate 22 and the pressure generating chamber bottom plate 24 are stacked and fired so as to be integrated without an adhesive. Subsequently, the vibration plate 23 and the piezoelectric actuator 40 are formed. When a ceramic material is used to form the flow path forming substrate 22 and the vibration plate 23, a clay-like ceramic material is molded, and the pressure generating chamber 21 is formed. The flow path forming substrate 22, the vibration plate 23, and the pressure generating chamber bottom plate 24 are stacked on top of one another and fired so as to be integrated without an adhesive. When a ceramic material is used, as specifically described later, the vibration plate 23 and the piezoelectric layer 42 can be formed at the same time by firing the piezoelectric material, and the vibration plate 23 can be bonded to the piezoelectric actuator 40 without an adhesive. Alternatively when a material other than the ceramic material such as a metal material is used to form the flow path forming substrate 22 and the pressure generating chamber bottom plate 24, these components may be bonded with an adhesive or a thermal welding film, or may be integrated by directly bonding the metal materials to each other by thermal compression.

The flow path unit 30 includes a substrate 31 having a liquid feeding port bonded to the pressure generating chamber bottom plate 24 in the actuator unit 20, a manifolded substrate 33 having the manifold 32 serving as a common ink chamber for the pressure generating chambers 21, a compliance substrate 50 disposed on the surface of the manifolded substrate 33 on the side opposite to the surface including the substrate 31 having a liquid feeding port, and a nozzle plate 35 having the nozzle openings 34.

The substrate 31 having a liquid feeding port is made of a ceramic material such as alumina ($Al_2O_3$) or zirconia ($ZrO_2$), an inorganic film such as silicon oxide, or a metal material such as stainless steel (SUS). The substrate 31 includes nozzle communicating holes 36 connecting the nozzle openings 34 to the pressure generating chambers 21, and ink feeding ports 37 drilled in the substrate 21. The ink feeding port 37 and the feed communicating hole 25 connect the manifold 32 to the pressure generating chamber 21. The substrate 31 includes an ink introducing port 38 that communicates with the manifold 32 and that feeds an ink to the manifold from an external ink tank.

The manifolded substrate 33 includes an anticorrosive plate material suitable for forming an ink flow path such as a ceramic material such as alumina ($Al_2O_3$) or zirconia ($ZrO_2$), an inorganic film such as silicon oxide, or a metal material such as stainless steel (SUS), the manifold 32 receiving an ink fed from an external ink tank (not shown) and then feeding the ink to the pressure generating chamber 21, and nozzle communicating holes 39 communicating between the pressure generating chamber 21 and the nozzle openings 34.

The compliance substrate 50 is bonded to the surface of the manifolded substrate 33 on the side opposite to the surface including the substrate 31 having a liquid feeding port so as to seal the bottom surface of the manifold 32. The region of the compliance substrate 50 facing the manifold 32 is formed so as to be thinner than other regions of the compliance substrate 50 and defines a compliance portion 51 that deforms in accordance with changes in pressure in the manifold 32.

The compliance substrate 50 includes nozzle communicating holes 52 vertically penetrating through the compliance substrate 50 so as to communicate between the nozzle communicating holes 39 disposed in the manifolded substrate 33 and the nozzle openings 34. Namely, the ink fed from the pressure generating chamber 21 is discharged from the nozzle openings 34 through the nozzle communicating holes 36, 39, and 52, respectively, disposed in the substrate 31 having a liquid feeding port, the manifolded substrate 33, and the compliance substrate 50.

The nozzle plate 35 includes a thin plate made of a metal material such as stainless steel (SUS), an organic substance such as a polyimide resin, or a ceramic material such as a silicon single-crystal substrate, and the nozzle openings 34 disposed at the same alignment pitch (first direction X) as that of the pressure generating chamber 21. The nozzle plate 35 is bonded to the surface of the compliance substrate 50 on the side opposite to the surface including the flow path forming substrate 22.

Such a flow path unit 30 is formed by fixing the substrate 31 having a liquid feeding port, the manifolded substrate 33, the compliance substrate 50, and the nozzle plate 35 with an adhesive or a thermal welding film. These substrates forming the flow path unit 30 can be integrated without an adhesive by using a ceramic material for these substrates.

The flow path unit 30 is bonded and fixed to the actuator unit 20 with an adhesive or a thermal welding film.

The thus-configured ink jet recording head 10 takes the ink into the manifold 32 through the ink introducing port 38 from an ink storing unit such as an ink cartridge and fills the liquid flow path from the manifold 32 to the nozzle openings 34 with the ink. The piezoelectric actuators 40 receive a recording signal through the wiring substrate 60 from the driving circuit not shown, and as a result, a voltage is applied to the respective piezoelectric actuators 40 corresponding to the pressure generating chambers 21 thereby flexibly deforming the piezoelectric actuators 40 and the vibration plate 23. The deformation increases the pressure inside of the pressure generating chambers 21, which causes ink droplets to be ejected from the nozzle openings 34.

The method for manufacturing such an ink jet recording head 10, particularly the method for manufacturing the actuator unit will be described in detail with reference to FIGS. 3 and 4. FIGS. 3 and 4 are sectional views showing a method for manufacturing an ink jet recording head as an exemplary liquid ejecting head of First Embodiment of the invention.

Figure 3A:
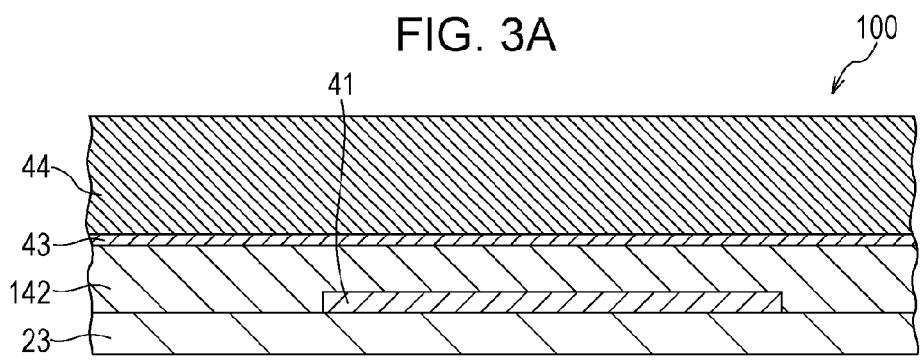
FIGS. 3A to 3C are sectional views showing a method for manufacturing a recording head according to First Embodiment of the invention.
Figure 4:
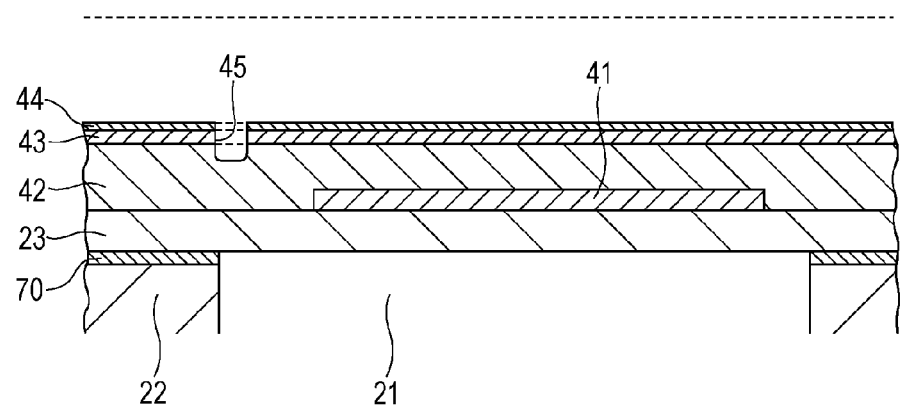
FIG. 4 is a sectional view showing the method for manufacturing a recording head according to First Embodiment of the invention.

First, as shown in FIG. 3A, the first electrode 41, a piezoelectric material layer 142 to be formed into the piezoelectric layer 42, the second electrode 43, and the reinforcing member 44 were stacked to form a laminate 100 (first step). In the present embodiment, further, the vibration plate 23 was disposed on the surface of the first electrode 41 on the side opposite to the surface including the piezoelectric layer 42 to form the laminate 100.

Examples of the piezoelectric material layer 142 to be formed into the piezoelectric layer 42 include a high dielectric ceramic material that has an electrical-mechanical conversion effect and that is applied onto the first electrode 41. The material used for the piezoelectric layer 42 can be a material containing lead (Pb), titanium (Ti), and zirconium (Zr), for example, a high dielectric piezoelectric material such as lead zirconate titanate (PZT), or a material containing a metal oxide such as niobium oxide, nickel oxide, or magnesium oxide. Specifically, lead titanate ($PbTiO_3$), lead zirconate titanate ($Pb(Zr,Ti)O_3$), lead zirconate ($PbZrO_3$), lead lanthanum titanate (($Pb,La)TiO_3$), lead lanthanum zirconate titanate (($Pb,La)(Zr,Ti)O_3$), or lead magnesium niobate zirconium titanate ($Pb(Zr,Ti)(Mg,Nb)O_3$) can be used.

Alternatively, the piezoelectric layer 42 may be made of a composite oxide having a perovskite structure and containing a lead-free piezoelectric material containing no lead such as bismuth ferrate or bismuth ferrate manganate and barium titanate or bismuth potassium titanate.

Such a piezoelectric material layer 142 can be formed as follows: for example, powdery ceramic nanoparticle powders are adhered to each other directly or with a binder such as an organic binder to mold the nanoparticle powders into the piezoelectric material layer 142. Such a piezoelectric material layer 142 can be easily molded into the shape of the piezoelectric layer 42 in the present embodiment.

The first electrode 41 and the second electrode 43 can be formed by screen printing the piezoelectric material, for example. Preferably, the first electrode 41 and the second electrode 43 are formed of a conductive material having thermal resistance against temperatures used when heating the piezoelectric material layer 142 in order to form the piezoelectric layer 42 in the subsequent step.

Preferably, the reinforcing member 44 is formed of a material having thermal resistance against temperatures used when heating the piezoelectric material layer 142 in order to form the piezoelectric layer 42. Preferably, the reinforcing member 44 has a coefficient of linear expansion substantially equal to that of the material used for the piezoelectric material layer 142. Such a reinforcing member 44 can suppress warpage of the laminate. When the piezoelectric material layer 142 is heated in order to form the piezoelectric layer 42, superfluous components in the piezoelectric layer 42 are burned up and as a result, the piezoelectric layer 42 contracts. If the reinforcing member 44 does not contract in the same manner as the piezoelectric material layer 142 does, the laminate on the reinforcing member 44 side may warp into a depressed shape. Consequently, the reinforcing member 44 is preferably formed of a material having a coefficient of linear expansion the same as that of the material used for the piezoelectric material layer 142 or the same material as that used for the piezoelectric material layer 142. By using the same material for the reinforcing member 44 and the piezoelectric material used formed into the piezoelectric layer 42, warpage, cracking, and peeling caused by heating of the piezoelectric actuator 40 can be suppressed.

The reinforcing member 44 is formed of a conductive material. Even if the reinforcing member 44 remains on the second electrode after the step of removing the reinforcing member 44, a through hole 45 does not need to be formed in the reinforcing member 44 to connect to the wiring substrate 60, simplifying the process. The same material may be used for the reinforcing member 44 and the second electrode 43. In this case, the second electrode 43 and the reinforcing member 44 may be stacked, or a thick single layer of the second electrode 43 may be formed so as to substantially function also as the reinforcing member 44. Alternatively, a material having an electric resistance higher than that of the second electrode 43 can be used for the reinforcing member 44 because some of the reinforcing member 44 is removed in the subsequent step thereby making the reinforcing member 44 thinner. Namely, if an expensive material such as platinum, gold, and silver is used for the second electrode 43 and an inexpensive material having an electric resistance higher than that of the material used for the second electrode 43 is used for the reinforcing member 44, the electric resistance can be prevented from significantly increasing because of the reduced thickness of the reinforcing member 44 remaining on the second electrode 43, leading to a reduction in cost.

Such a reinforcing member 44 disposed in the laminate 100 enhances the rigidity of the entire laminate 100 and, as a result, reduces the likelihood of breakage such as cracking and chipping of the laminate 100 when the laminate 100 is handled or is bonded to the flow path forming substrate 22 in the subsequent step. The reinforcing member 44 disposed in the laminate 100 enhances the rigidity of the laminate 100 and enables reduction of the thickness of the piezoelectric material layer 142 to be formed into the piezoelectric layer 42 (thickness in the vertical direction). When the reinforcing member 44 is not disposed, the laminate is less rigid and readily cracks or chips. Accordingly, the thickness of the piezoelectric material layer 142 to be formed into the piezoelectric layer 42 cannot be reduced. In the present embodiment, the rigidity of the laminate 100 can be enhanced, and allows reduction in the thickness of the piezoelectric material layer 142 to be formed into the piezoelectric layer 42. This enables active portions of the piezoelectric layer 42 (piezoelectric actuators 40) to be disposed in high density.

The vibration plate 23 is formed of a thin plate made of alumina ($Al_2O_3$), zirconia ($ZrO_2$), a piezoelectric material used for the piezoelectric material layer 142, a ceramic material such as a silicon single-crystal substrate, a metal material such as stainless steel (SUS), or an organic substance such as a polyimide resin. The vibration plate 23 is formed of zirconia or alumina, a ceramic identical to the piezoelectric material used for the piezoelectric layer described later, an inorganic film such as silicon oxide, or a metal material such as stainless steel (SUS). In the present embodiment, because the same material is used to form the piezoelectric material layer 142 and the vibration plate 23, the vibration plate 23 is heated and fired at the same time as when the piezoelectric material layer 142 is heated in the subsequent step of forming the piezoelectric layer 42. In other words, when the vibration plate 23 is disposed as a part of the laminate 100, the material used for the vibration plate 23 needs to have thermal resistance against temperatures used when firing the piezoelectric material layer 142 in the subsequent step of forming the piezoelectric layer 42. The vibration plate 23 may be disposed not in the laminate 100. When the laminate 100 is bonded to the flow path forming substrate 22 in the subsequent fourth step, the vibration plate 23 may be bonded between the laminate 100 and the flow path forming substrate 22. Alternatively, the vibration plate 23 may be integrally formed with the flow path forming substrate 22 when the flow path forming substrate 22 is formed. In this case, the material used for the vibration plate 23 can be a material having no thermal resistance against temperatures used when firing the piezoelectric material layer 142.

Figure 3B:
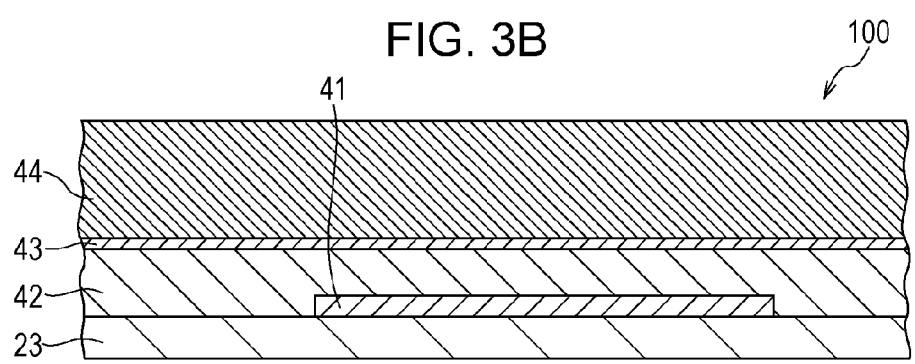

Next, as shown in FIG. 3B, by heating the laminate 100, the piezoelectric layer 42 is formed. As a result, the piezoelectric actuator 40 is formed (second step). When the same piezoelectric material is used for the reinforcing member 44 and the piezoelectric layer 42, the reinforcing member 44 is also fired in this heating step.

Figure 3C:
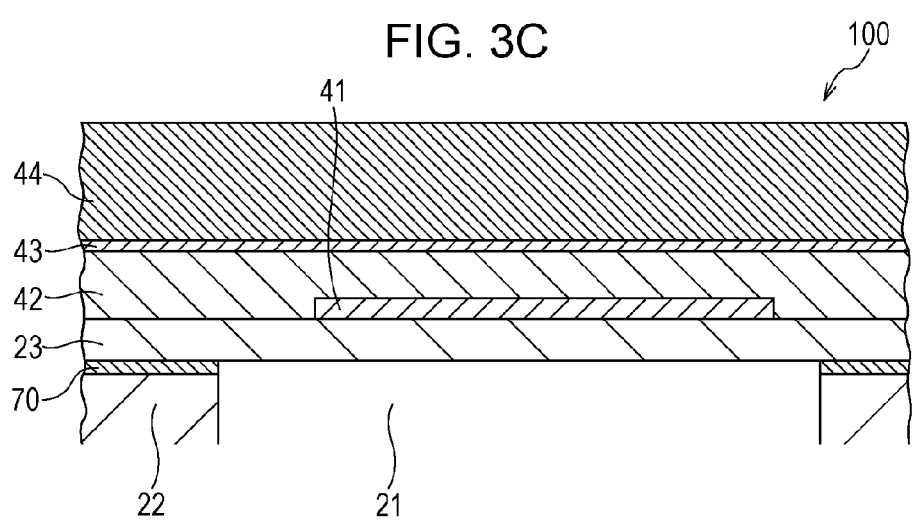

Next, as shown in FIG. 3C, the laminate 100 is bonded to the flow path forming substrate 22 (third step). In the present embodiment, the laminate 100 is bonded to the flow path forming substrate 22 with the adhesive 70. The flow path forming substrate 22 includes the pressure generating chamber 21 and other components disposed in advance. The flow path forming substrate 22 may be formed as a single component, and other members that form the actuator unit 20 such as the pressure generating chamber bottom plate 24 may be bonded to the flow path forming substrate 22. Further, the flow path forming substrate 22 may be bonded to the substrate 31 having a liquid feeding port, the manifolded substrate 33, the compliance substrate 50, and the nozzle plate 35 that form the flow path unit 30.

Next, as shown in FIG. 4, the reinforcing member 44 is partially removed (fourth step). In the present embodiment, the reinforcing member 44 is partially removed such that part of the reinforcing member 44 remains on the second electrode 43, and part of the reinforcing member 44 and part of the second electrode 43 that serve as the connection region are vertically removed to form the through hole 45.

The reinforcing member 44 can be partially removed by dry etching such as ion milling, blasting such as sand blasting, a mechanical process such as chemical mechanical polishing (CMP), or wet etching, for example. When the same material is used to form the reinforcing member 44 and the piezoelectric material layer 142 (piezoelectric layer 42), the piezoelectric material layer 142, it is undesirable to etch by wet etching. To avoid this, the reinforcing member 44 may be partially removed by a method other than wet etching, or the piezoelectric material layer 142 may be protected by a protective film to prevent the piezoelectric material layer 142 from being wet etched.

In the present embodiment, the reinforcing member 44 intendedly remains on the second electrode 43 excluding the connection region, while the reinforcing member 44 can be completely removed. If the reinforcing member 44 is completely removed by dry etching or the mechanical process, part of the second electrode 43 is vertically removed. To avoid this, the second electrode 43 needs to be formed thick enough to include the thickness to be removed. Cost will increase when the second electrode 43 is formed thick enough to include the thickness to be removed. In the present embodiment, however, the reinforcing member 44 remains on the second electrode 43. Such a configuration does not need the increase in the thickness of the second electrode 43 as described above, reducing cost. Namely, the fourth step of removing the reinforcing member 44 includes removing the reinforcing member 44 completely and removing the reinforcing member 44 partially.

When the conductive material is used for the reinforcing member 44 as described above, the wiring layer 61 of the wiring substrate 60 can be electrically connected to the second electrode 43 through the reinforcing member 44 without forming the through hole 45 in the reinforcing member 44.

Subsequently, the actuator unit 20 is bonded to the flow path unit 30, and the piezoelectric actuator 40 is bonded to the wiring substrate 60 with the electric conductor 46 to fabricate the ink jet recording head 10 shown in FIG. 2.

As describe above, the reinforcing member 44 is disposed in the laminate 100 to enhance the rigidity of the laminate 100. The enhanced rigidity can reduce cracking and chipping of the laminate 100 which is caused by pressure when handling the laminate 100 or bonding the laminate 100 to the flow path forming substrate 22. Consequently, the thickness of the piezoelectric material layer 142 to be formed into the piezoelectric layer 42 can be reduced and the piezoelectric layer 42, that is, the piezoelectric actuators 40 can be disposed in high density.

In the present embodiment, after the second step of heating the piezoelectric material layer 142 of the laminate 100 in order to form the piezoelectric layer 42 is performed, the third step of bonding the laminate 100 to the flow path forming substrate 22 is performed. The steps can be performed in any order. For example, after the third step of bonding the laminate 100 to the flow path forming substrate 22 may be performed, the second step of heating the laminate 100 and the flow path forming substrate 22 to fire the piezoelectric material layer 142 in order to form the piezoelectric layer 42 may be performed. When the laminate 100 is bonded to the flow path forming substrate 22 and the piezoelectric material layer 142 is heated, a material having thermal resistance against temperatures used for formation of the piezoelectric layer 42 needs to be used for the materials for the flow path forming substrate 22 and the adhesive 70.

Other Embodiments

One embodiment of the invention has been described, but the basic configuration of embodiments of the invention will not be limited to the configuration described above.

In First Embodiment, the piezoelectric actuator 40 including a laminate formed of the first electrode 41, the piezoelectric layer 42, and the second electrode 43 has been exemplified, but is not limited to this configuration. For example, the electrodes may be sandwiched between two or more piezoelectric layers 42.

In First Embodiment, the piezoelectric actuator 40 including the first electrode 41, the piezoelectric layer 42, and the second electrode 43 in the direction of stacking the flow path forming substrate 22 and the pressure generating chamber bottom plate 24 has been exemplified, but is not limited to this configuration. For example, the direction of stacking the first electrode 41, the piezoelectric layer 42, and the second electrode 43 may intersect perpendicular to the direction of stacking the flow path forming substrate 22 and the pressure generating chamber bottom plate 24.

In First Embodiment, when the piezoelectric material layer 142 to be formed into the piezoelectric layer 42 of the laminate 100 is formed, powdery ceramic nanoparticles are adhered to each other directly or with a binder such as an organic binder to mold the nanoparticls into the piezoelectric material layer 142, but the formation of the piezoelectric material layer 142 is not limited to this. The piezoelectric layer 42 can also be formed by a sol-gel method, a liquid phase method such as a metal-organic decomposition (MOD) method, a physical vapor deposition (PVD) method such as a sputtering method and a laser abrasion method (gaseous phase method).

In First Embodiment, the vibration plate 23 is handled as a part of the laminate 100. The vibration plate 23 may be integrated with the flow path forming substrate 22. Alternatively, when the laminate 100 and the flow path forming substrate 22 are stacked, the vibration plate 23 may be added to stack these three components.

In First Embodiment, an exemplary method for manufacturing an ink jet recording head as an example of the liquid ejecting head has been described, but the aspect of the invention covers a wide range of the method for manufacturing a liquid ejecting head and can be applied to the method for manufacturing a liquid ejecting head that ejects a liquid other than the ink. Examples of other liquid ejecting heads include a variety of recording heads used in image recording apparatuses such as printers, color material ejecting heads used in the production of color filters for liquid crystal displays, electrode material ejecting heads used in the formation of electrodes for organic EL displays and electric field emission displays (FED), and bioorganic substance ejecting heads used in the production of biochips. The method described in First Embodiment can also be applied to the method for manufacturing a liquid ejecting head.

What is claimed is:

1. A method for manufacturing a liquid ejecting head including a laminate formed on a flow path substrate having a flow path communicating with nozzle openings that eject a liquid, the laminate including a first electrode, a piezoelectric material layer, and a second electrode, the method comprising:

forming the laminate, wherein a piezoelectric material is formed on the first electrode, the second electrode is formed on the piezoelectric material, and a reinforcing member is formed directly on the second electrode, heating the laminate to form the piezoelectric material layer made of piezoelectric material, bonding the laminate to the flow path substrate on a first electrode side, and removing the reinforcing member, wherein in the removing of the reinforcing member, the reinforcing member in a predetermined region excluding a connection region is partially removed to leave the reinforcing member having a predetermined thickness; at least part of the reinforcing member and at least part of the second electrode in the connection region are removed to form a through hole, and an electrically conductive material is disposed in the through hole to form an electric conductor.

2. A method for manufacturing a liquid ejecting head including a laminate formed on a flow path substrate having a flow path communicating with nozzle openings that eject a liquid, the laminate including a first electrode, a piezoelectric material layer, and a second electrode, the method comprising:

forming the laminate, wherein a piezoelectric material is formed on the first electrode, the second electrode is formed on the piezoelectric material, and a reinforcing member is formed directly on the second electrode, heating the laminate to form the piezoelectric material layer made of piezoelectric material, bonding the laminate to the flow path substrate on a first electrode side, and removing the reinforcing member, wherein the reinforcing member is formed of the same material as that used for the second electrode.

3. The method for manufacturing a liquid ejecting head according to claim 1, wherein the connection region is a region in which the first electrode is not disposed.

4. The method for manufacturing a liquid ejecting head according to claim 1, wherein in the bonding of the laminate, the flow path substrate is bonded to the laminate with a vibration plate being interposed between the flow path substrate and the laminate.

5. The method for manufacturing a liquid ejecting head according to claim 1, wherein the reinforcing member is formed of the same material as that used for the second electrode.

6. The method for manufacturing a liquid ejecting head according to claim 1, wherein the reinforcing member is formed of the same material as that used for the piezoelectric material.

7. The method for manufacturing a liquid ejecting head according to claim 2, wherein in the bonding of the laminate, the flow path substrate is bonded to the laminate with a vibration plate being interposed between the flow path substrate and the laminate.

* * * * *